(12) United States Patent
Thallner

(10) Patent No.: US 8,157,615 B2
(45) Date of Patent: Apr. 17, 2012

(54) DEVICE AND PROCESS FOR APPLYING AND/OR DETACHING A WAFER TO/FROM A CARRIER

(76) Inventor: Erich Thallner, St. Florian (AT)

( * ) Notice: Subject to any disclaimer, the term of this patent is extended or adjusted under 35 U.S.C. 154(b) by 567 days.

(21) Appl. No.: 12/402,542

(22) Filed: Mar. 12, 2009

(65) Prior Publication Data

US 2009/0258583 A1 Oct. 15, 2009

(30) Foreign Application Priority Data

Apr. 12, 2008 (DE) .......................... 10 2008 018 536

(51) Int. Cl.
*B24B 49/00* (2012.01)

(52) U.S. Cl. ............ 451/7; 451/388; 451/390; 451/289; 451/53

(58) Field of Classification Search .................. 451/390, 451/388, 7, 53, 289, 385, 57, 66; 414/627, 414/752.1; 294/64.1, 188; 269/21, 289 R; 29/281.1; 271/90
See application file for complete search history.

(56) References Cited

U.S. PATENT DOCUMENTS

| | | | | |
|---|---|---|---|---|
| 3,307,869 A | * | 3/1967 | Warfel | 294/189 |
| 3,627,369 A | * | 12/1971 | Nixon | 294/189 |
| 5,674,115 A | * | 10/1997 | Yamashita et al. | 451/289 |
| 5,775,980 A | * | 7/1998 | Sasaki et al. | 451/285 |
| 5,851,140 A | * | 12/1998 | Barns et al. | 451/288 |
| 5,906,533 A | * | 5/1999 | Harris et al. | 451/41 |
| 6,227,008 B1 | * | 5/2001 | Shetterly et al. | 65/273 |
| 6,271,503 B1 | * | 8/2001 | Hall et al. | 219/444.1 |
| 6,431,623 B1 | | 8/2002 | Roeters et al. | 294/64.1 |
| 6,991,524 B1 | * | 1/2006 | Cooper et al. | 451/58 |
| 7,078,262 B2 | * | 7/2006 | Yamamoto et al. | 438/106 |
| 7,081,045 B2 | * | 7/2006 | Boo et al. | 451/288 |
| RE39,471 E | * | 1/2007 | Nakashiba et al. | 451/5 |
| 7,527,271 B2 | * | 5/2009 | Oh et al. | 279/3 |
| 7,549,833 B2 | * | 6/2009 | Tang | 414/797 |
| 2002/0094766 A1 | | 7/2002 | Zuniga et al. | 451/287 |
| 2005/0153635 A1 | * | 7/2005 | Boo et al. | 451/285 |
| 2007/0232209 A1 | * | 10/2007 | Boo et al. | 451/388 |

FOREIGN PATENT DOCUMENTS

EP 0 884 766 11/2006

* cited by examiner

*Primary Examiner* — George Nguyen
(74) *Attorney, Agent, or Firm* — Kusner & Jaffe

(57) ABSTRACT

The invention relates to a device for applying and/or detaching a wafer to/from a carrier with
  a deformable membrane which can be aligned parallel to the contact surface of the wafer, with one contact side for at least partial contact-making with the contact surface,
  deformation means which are located backward to the contact side for deformation of the membrane which can be controlled in a defined manner and
  adhesion means for adhesion of the wafer to the membrane and process for detaching and/or applying a wafer to/from a carrier with a corresponding device.

15 Claims, 1 Drawing Sheet

DEVICE AND PROCESS FOR APPLYING AND/OR DETACHING A WAFER TO/FROM A CARRIER

FIELD OF THE INVENTION

The invention relates to applying and/or detaching a wafer to/from a carrier.

BACKGROUND OF THE INVENTION

Re-thinning of wafers is often necessary in the semiconductor industry and can take place mechanically and/or chemically. For re-thinning, the wafers are in general temporarily fixed on a carrier, there being various methods for fixing. Carrier materials are for example foils, glass substrates or silicon wafers.

Depending on the carrier materials which are being used and the connecting layers between the carrier and wafer which are being used, different processes are known for dissolving or destroying the connecting layer, such as for example using UV light, laser beams, temperature action or solvents.

Detachment is increasingly one of the most critical process steps, since thin substrates with substrate thicknesses of a few microns break easily during detachment/removal or suffer damage due to the forces which are necessary for the process of detachment.

Moreover thin substrates have hardly any stability of shape and typically curl without support material. During handling of the re-thinned wafers therefore fixing and support of the wafers are essentially critical.

Therefore the object of this invention is to devise a device and a process in order to detach a wafer from a carrier as much as possible without destruction. Further object of the invention is to device and a process with which application of a wafer to a carrier free of bubbles as much as possible.

This object is achieved with the features of claims 1, 14 and 16. Advantageous developments of the invention are given in the dependent claims. All combinations of at least two of the features given in the specification, the claims and/or the figures are included within the framework of the invention. For indicated ranges of values, values which lie within the indicated limits will also be disclosed as boundary values and can be claimed in any combination.

SUMMARY OF THE INVENTION

The idea of the invention is to devise a device to apply the detachment force acting on the re-thinned wafer by deformation of the contact-making surface in a controlled manner to the wafer, preferably first the edge of the generally round wafer being detached by the wafer adhering to the contact-making side.

A combination of horizontal removal force and vertical deflection is preferred, by which successive and careful lifting of the edge is effected.

In other words, the detachment force rises from the periphery of the wafer to the center during detachment, especially a transverse force component being advantageous in addition.

According to the apparatus, the invention relates to a device for applying and/or detaching a wafer to/from a carrier
- with a deformable membrane which can be aligned parallel to the contact surface of the wafer, with one contact side for at least partial contact-making with the contact surface,
- deformation means which are located backward to the contact side for deformation of the membrane which can be controlled in a defined manner and
- with adhesion means for adhesion of the wafer to the membrane.

The re-thinned wafer in interplay with adhesion of the wafer to the membrane can be detached from the carrier in a controlled manner, preferably from the outside to the inside, by deformation of the membrane which can be controlled in a defined manner.

In one advantageous configuration of the invention the membrane is omnipermeable, especially by holes which penetrate the membrane, preferably the number and/or diameter of the holes being defined. This measure makes it possible to suction the wafer onto the membrane, at a given number and/or given diameter of the holes with a defined adhesive force. Thus, adverse effects of vacuum grooving on the wafer are also avoided.

A corresponding effect is achieved by the membrane being exposed to a pressure difference by the adhesion means.

In one especially preferred embodiment of the invention the adhesion means comprise the following:
- a suction space formed by a suction trough and a membrane which covers the suction trough and
- a vacuum pump which is connected to the suction space.

It is furthermore advantageously provided that the suction trough be formed by an especially impermeable bottom which can be deformed by pressure, and a peripheral wall since in this way compressive forces can be transferred into the suction space from the outside by way of the deformable bottom.

In one advantageous configuration of the invention the deformation means comprise the following:
- the deformable bottom of the suction trough and
- at least one, preferably a plurality of spacers for defined spacing of the membrane from the bottom.

The aforementioned configuration enables especially effective transfer of compressive forces to the membrane and by the bottom having a similar basic shape to the membrane and also to the wafer, the compressive forces which prevail over the surface of the deformable bottom can be optimally relayed to the membrane.

In another advantageous embodiment of the invention the spacers are made free of edges, especially spherical, by which a distribution and transfer of forces to the membrane and thus to the wafer as uniform as possible are possible. Preferably the spacers are distributed from the center of the membrane uniformly over the surface of the membrane. The spacers can have different geometries, but are preferably identical. The suction space is more preferably filled with a plurality of small balls as spacers.

Furthermore the deformation means can advantageously comprise the following:
- a pressure space formed by a pressure trough and a bottom which covers the pressure trough and
- a pressure pump which is connected to the pressure space.

The pressure space can be exposed to a pressure of up to 10 bar.

By means of the aforementioned configuration of the deformation means not only the adhesion means, but also the deformation means can be operated by a vacuum pump, and possibly even synergy effects of the vacuum means can be used.

For example, the vacuum pump could be the pressure pump at the same time.

Furthermore, it is advantageously provided that the deformation means have at least one limiter which is made to limit the deformation of the bottom in the direction of the pressure space, especially such that the bottom is planar when the bottom is adjacent to the limiter. By limiting the deformation of the bottom, advantageously it becomes possible to dictate the initial position of the device which is present when at least in the pressure space atmospheric pressure/ambient pressure or negative pressure down to a vacuum prevails.

By the area of the contact side being smaller that the area of the contact surface in order to prevent transfer of cement beads which may form when the wafer is removed from the carrier to the membrane, contamination of the membrane and especially its holes is avoided.

Advantageously, in one configuration of the device as claimed in the invention there are heating means which are integrated in a receiving unit for holding the carrier and/or are located underneath the receiving unit for holding the carrier. In the arrangement of the heating means underneath the receiving unit the receiving unit before heating of the heating means can be moved away for detaching the wafer so that direct action of heat on the carrier and wafer is possible.

Because the suction space is exposed to a negative pressure, especially less than 500 mbar, the heat acts optimally on the connecting means between the wafer and carrier. The heating means can thus even be made with smaller dimensions.

In order to destroy the connecting force, it is important to bring the connecting means very precisely and uniformly to the temperature which is necessary for neutralizing the adhesive property. This is achieved especially by the cooling on the opposite side of heat action being reduced and minimized. This yields a very small temperature difference between the temperature of the carrier and of the wafer (high uniformity). If this were not the case, the carrier under certain circumstances would have a high temperature especially on the side exposed to the radiation source and the temperature gradient toward the membrane of the water would be very large. Since the wafer is especially thin and silicon has very good thermal conductivity, in this case the adhesive layer would not reach the temperature which is necessary for neutralizing the adhesive property. Therefore it is especially important to have a high insulation value for the wafer.

According to the process the object is achieved by a process for detaching a wafer from a carrier with a prescribed device, which process has the following process steps, especially in the indicated sequence:

a) alignment of the deformable membrane with its contact side parallel to the contact surface of the wafer,
b) making contact between the membrane and the wafer, and
c) deformation and detachment of the membrane by the deformation means in the direction of the contact side, the deformation of the membrane taking place convexly.

When the deformable membrane is aligned with its contact side parallel to the contact surface of the wafer, a wedge fault can be equalized by processes and devices known in the prior art.

For making contact, it is both possible to move the membrane to the wafer and also vice versa or by movement of the two components, membrane and wafer, toward one another.

Instead of the membrane, an adhesive film can also be used.

By adhesion taking place by application of a negative pressure to the back of the membrane, the negative pressure on the back of the membrane achieves the additional effect that the vacuum ensures outstanding insulation during heating and thus uniform heating with low energy loss can be guaranteed.

The deformation of the membrane when the wafer is detached advantageously takes place convexly, i.e. the detachment force rises from the edge of the membrane as uniformly as possible toward the center of the membrane.

Conversely, the process as claimed in the invention can also take place for applying a wafer to a carrier with the above described device by the following process steps which proceed especially in the following sequence:

a) making contact between the membrane and the wafer and adhesion of the wafer to the membrane by the adhesion means,
b) alignment of the deformable membrane and of the wafer adhering to it with a carrier,
c) convex deformation of the membrane and of the wafer by means of the deformation means and application of the wafer to the carrier.

Application takes place advantageously based on the convex deformation of the wafer from the center of the wafer so that air inclusions which are often inevitable when the wafer is resting flat on the carrier are largely avoided.

Other advantages, features, and details of the invention will become apparent from the following description of preferred embodiments and using the drawings.

DETAILED DESCRIPTION OF PREFERRED EMBODIMENTS

In the figures, the same components and the components with the same function are identified with the same reference numbers.

Figure 1:
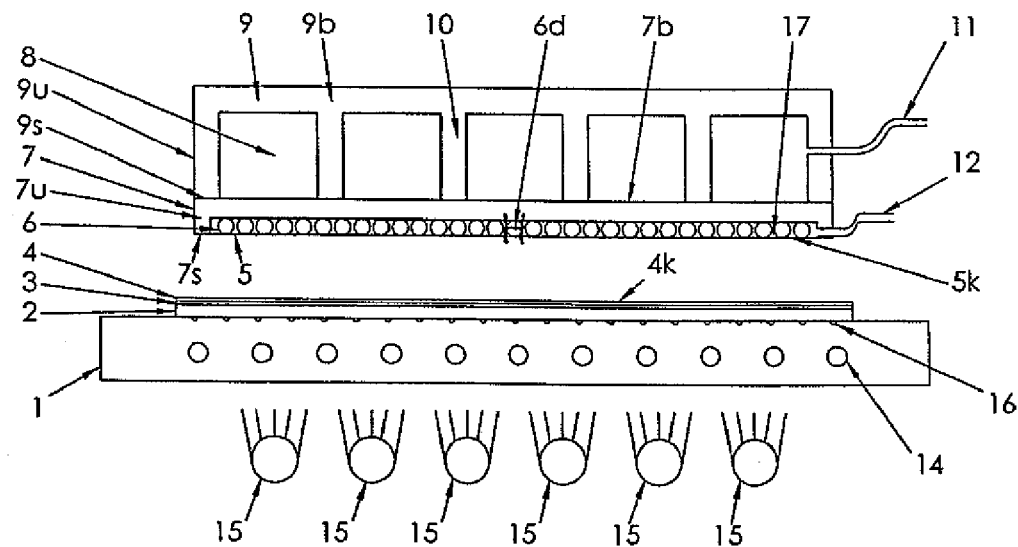
FIG. 1 shows a schematic side view of the device as claimed in the invention.
Figure 2:
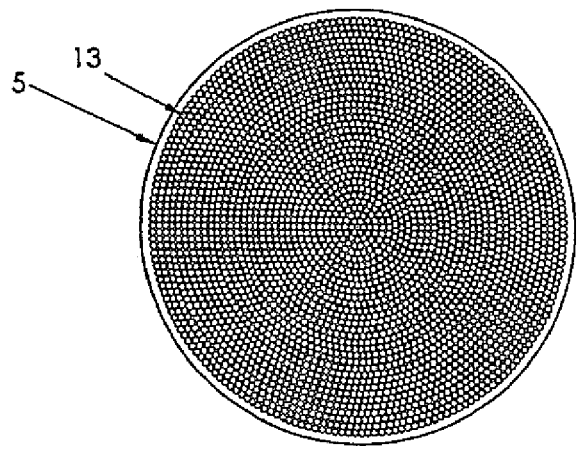
FIG. 2 shows a schematic top view of the membrane as claimed in the invention.

FIG. 1 schematically shows a device as claimed in the invention as an embodiment, components such as the housing which surrounds the device or positioning and/or adjusting means, such as for example a robot arm, not being shown, since they are relatively known in the prior art.

A carrier 2 can be fixed by negative pressure fixing means 16 on a receiving unit 1 with the heating means 14 which are integrated into it and which are made here as heating coils. A wafer 4 is joined to the carrier 2 by connecting means 3, for example a cement, and the wafer has been re-thinned in a previous process step so that one contact surface $4k$ of the wafer 4 on the side of the wafer 4 facing away from the carrier 2 is exposed.

An important component of the device as claimed in the invention is the means consisting of the components located above the wafer 4; on the bottom of the means there is a membrane 5 with its contact side $5k$ opposite the contact surface $4k$ of the wafer 4.

A possible lack of parallelism resulting from a wedge of the wafer stack is equalized by so-called wedge fault equalization which is relatively known in the prior art.

The contact side $5k$ is accordingly aligned as parallel as possible to the contact surface $4k$ and flush to the contact surface $4k$. The contact surface $4k$ and the contact side $5k$ are generally circular.

The membrane 5 is fixed nonpositively and tightly on one annular end face $7s$, the membrane 5 having holes 13 distributed over the contact side $5k$ in order to be able to suction the wafer 4 by way of the pressure difference prevailing on the membrane 5.

Above the membrane 5 a peripheral wall 7u and a bottom 7b of the suction trough 7 together with the membrane 5 form a suction space 17 which can be exposed to a negative pressure by a vacuum pump which is not shown via a suction line 12.

The bottom 7b in its initial position which is shown in FIG. 1 is plane and parallel to the membrane 5 so that the suction space 17 essentially has a flat, cylindrical shape.

Spherical spacers 6 are located uniformly distributed in the suction space 17 and their ball diameter 6d corresponds in the initial state to the distance between the bottom 7b and the membrane 5.

Above the suction trough 7 there is roughly congruently in shape a pressure trough 9 with one end face 9s, a peripheral wall 9u and a bottom 9b whose end face 9s rests flat and tight on the bottom 7b of the suction space 7.

The space surrounded by the pressure trough 9 and the bottom 7b forms a pressure space 8 which is exposed to pressure by way of a pressure line 11 and a pump which is not shown. The pressure trough 9 is fixed to the suction trough 7, for example by a force on the bottom 9b of the pressure trough 9 or by some other nonpositive connection.

In the initial state which is shown in FIG. 1 and in which atmospheric pressure or ambient pressure prevails in the suction space 7 and in the pressure space 8, the impermeable bottom 7b is planar and adjoins the limiters 10 which are located between the bottom 7b and the bottom 9b in the pressure space 9.

Underneath the receiving unit 1 there can be other heating means 15 in addition or alternatively to the heating means 14.

The area of the contact side 5k is smaller than the area of the contact surface 4k of the wafer 4 in order to avoid contamination of the membrane 5 by connecting means 3 when the wafer 4 is detached from the carrier 2.

The detachment of the wafer 4 from the carrier 2 with the device shown in FIG. 1 proceeds as follows:

After re-thinning of the wafer 4 (wafer stack) which is fixed on the carrier 2 by the connecting means 3, this wafer stack is positioned on the receiving unit 1 from the re-thinning means by a robot arm which is not shown and then fixed on the receiving unit 1 by negative pressure fixing means 16. With the same or another robot arm the membrane 5 which is connected to the pressure space 9 and the suction space 7 is aligned with its contact side 5k parallel to the contact surface 4k and flush with it.

Then the membrane 5 is lowered onto the wafer 4 and makes contact with it in the unpressurized initial position shown in FIG. 1.

The robot arm can also transfer the wafer stack directly to the membrane 5 without fixing on the receiving unit 1 so that the receiving unit 1 can be omitted. In this case only heating means 15 are required. The transverse force when the carrier is detached to the wafer 4 is applied by the gripper 18 (FIG. 3) which is described below.

The membrane 5 is caused to adhere to the wafer 4 by the adhesion means consisting of the membrane 5 with holes, the suction space 17 and the vacuum pump which is connected via the suction line 12.

During this or subsequently to adhesion and/or contact-making of the membrane 5 with the wafer 4 the stack consisting of the wafers 4, connecting means 3 and carriers 2 is heated by the heating means 14 and/or the heating means 15, the suction space 17 being used as a heat insulator and regulator.

The process is controlled by way of a control unit which is not shown.

After reaching the temperature which is necessary for loosening the cement (connecting means 3) the wafer 4 adhering to the membrane is detached by convex deformation of the membrane 5 by the deformation means, detachment of the wafer 4 from the edge 4r of the wafer 4 taking place automatically. Preferably a transverse force is applied by way of relative movement of the carrier 2 to the membrane 5.

The deformation means are formed by the pressure space 8 which is exposed to pressure by way of the pressure line 11 and the pump which is not shown, as well as the impermeable deformable bottom 7b, the spacers 6 and the membrane 5.

The pressure trough 9 and the suction trough 7 can be made in one piece. Likewise the limiters 10 and/or the spacers 6 can be formed out of the bottoms 7b and/or 9b.

By applying an overpressure in the pressure space 8 the bottom 7b is convexly arched or dynamically deflected due to the more solid construction of the pressure trough 9, the deflection being proportional to the prevailing overpressure of up to 10 bar and thus can be programmed and controlled by the control unit.

Figure 3:
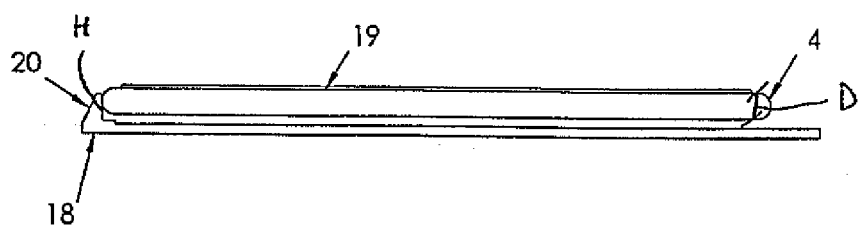
FIG. 3 shows a side view of a gripper engaging a wafer.

The deflection of the bottom 7b presses the spacers 6 in the direction of the membrane 5, by which the membrane 5 is likewise deflected analogously to the bottom 7b. The wafer can be detached by the edge from the carrier 2 by this effect of a uniform, precise and exactly programmable deflection of the membrane while maintaining the adhesive force on the membrane 5. In addition to the vertical force component over the membrane 5 the wafer 4 can be pushed away by a gripper 18 as shown in FIG. 3 in the horizontal direction, by which the wafer 4 is carefully detached from the carrier 2 without damaging the chip 19 which is located on the wafer 4.

The gripper 18 is made in the form of a hook, with a projection 20 which has a smaller height H than the thickness D of the wafer 4. The transverse force or horizontal force component can also be transferred by the receiving unit 1 or a vacuum gripper.

In order to enable exact adherence to the temperature in temporary thermal cement connections as the connecting means 3, in the receiving unit 1 and/or in the region of the suction space 17 there is one or more temperature sensors which enable monitoring of the applied temperature and control the detachment process by way of control software of the control means (not shown).

The stack of wafers 4, connecting means 3 and carriers 2 need only be heated from one side by the insulating action of the suction space 17.

The above described device can furthermore be used for a process for applying a wafer 4 to another carrier 2', for example a saw foil or a processed wafer and to prevent air inclusions in transfer or contact-making of the thin wafer 4 with the remaining carrier 2' application of the wafer 4 in arched form is especially advantageous.

This means that the wafer 4 which has been detached by the aforementioned process remains deflected on the membrane 5 and is aligned with the further carrier 2'. The convexly shaped wafer 4 is then seated in the center on the carrier 2' and by re-deformation, therefore lowering of the pressure in the pressure space 9, applied to the carrier 2, air inclusions being largely avoided.

The danger of air inclusions is especially great for adhesive foils so that this process makes it possible to deposit wafers on adhesive material without air inclusions.

The invention claimed is:

1. Device for applying and/or detaching a wafer to/from a carrier, said device comprising:

a deformable membrane which can be aligned parallel to the contact surface of the wafer, with one contact side for at least partial contact-making with the contact surface, deformation means which are located backward to the contact side for deformation of the membrane which can be controlled in a defined manner and adhesion means for adhesion of the wafer to the membrane, wherein the adhesion means comprises:

a suction space formed by a suction trough and the membrane disposed over the suction trough, wherein the suction trough is formed by an especially impermeable bottom which can be deformed by pressure, and a peripheral wall and a vacuum pump which is connected to the suction space.

2. Device as claimed in claim 1, wherein the membrane is omnipermeable, especially by holes which penetrate the membrane, preferably the number and/or diameter of the holes being defined.

3. Device as claimed in claim 1, wherein the membrane can be exposed to a pressure difference by the adhesion means.

4. Device as claimed in claim 1, wherein the deformation means comprise the following:

the bottom of the suction trough and at least one, preferably a plurality of spacers for defined spacing of the membrane from the bottom.

5. Device as claimed in claim 4, wherein the spacers are made free of edges, especially spherical.

6. Device as claimed in claim 1, wherein the deformation means comprise the following:

a pressure space formed by a pressure trough and the bottom of the suction trough which covers the pressure trough and a pressure pump which is connected to the pressure space.

7. Device as claimed in claim 6, wherein the deformation means have at least one limiter which is made to limit the deformation of the bottom in the direction of the pressure space, especially such that the bottom is planar when the bottom is adjacent to the limiter.

8. Device as claimed in claim 1, wherein the area of the contact side is smaller than the area of the contact surface.

9. Device as claimed in claim 1, wherein the device has heating means.

10. Device as claimed in claim 9, wherein the heating means are integrated into a receiving unit for holding the carrier.

11. Device as claimed in claim 9, wherein the heating means are located underneath a receiving unit for holding the carrier.

12. Process for detaching a wafer from a carrier with a device as claimed in claim 1 by the following process steps:

a) alignment of the deformable membrane with its contact side parallel to the contact surface of the wafer, b) making contact between the membrane and the wafer, and adhesion of the wafer to the membrane by the adhesion means, and c) deformation and detachment of the membrane by the deformation means in the direction of the contact side, the deformation of the membrane taking place convexly.

13. Process as claimed in claim 12, in which the carrier and the wafer before detachment of the wafer are heated by heating means to loosen a connecting means which is located between the wafer and carrier.

14. Process for applying a wafer to a carrier with a device as claimed in claim 13 by the following process steps:

a) making contact between the membrane and the wafer and adhesion of the wafer to the membrane by the adhesion means, b) alignment of the deformable membrane and of the wafer adhering to it with a carrier, and c) convex deformation of the membrane and of the wafer by the deformation means and application of the wafer to the carrier.

15. Device for applying and/or detaching a wafer to/from a carrier, said device comprising:

a deformable membrane which can be aligned parallel before contacting the deformable membrane to the contact surface of the wafer, with one contact side for at least partial contact-making with the contact surface, deformation means which are located backward to the contact side for deformation of the membrane which can be controlled in a defined manner and adhesion means for adhesion of the wafer to the membrane.

* * * * *